US012597474B2

(12) United States Patent
Wu

(10) Patent No.: US 12,597,474 B2
(45) Date of Patent: Apr. 7, 2026

(54) READING VOLTAGE MANAGEMENT METHOD AND STORAGE DEVICE

(71) Applicant: Hosin Global Electronics Co., LTD, Shenzhen (CN)

(72) Inventor: Tsung-Lin Wu, Hsinchu City (TW)

(73) Assignee: Hosin Global Electronics Co., LTD, Shenzhen (CN)

( * ) Notice: Subject to any disclaimer, the term of this patent is extended or adjusted under 35 U.S.C. 154(b) by 129 days.

(21) Appl. No.: 18/801,328

(22) Filed: Aug. 12, 2024

(65) Prior Publication Data

US 2025/0336447 A1 Oct. 30, 2025

(30) Foreign Application Priority Data

Apr. 26, 2024 (CN) .......................... 202410517907.9

(51) Int. Cl.
*G11C 16/10* (2006.01)
*G11C 16/26* (2006.01)
*G11C 16/34* (2006.01)

(52) U.S. Cl.
CPC ............ *G11C 16/26* (2013.01); *G11C 16/102* (2013.01); *G11C 16/3418* (2013.01)

(58) Field of Classification Search
CPC .... G11C 16/26; G11C 16/102; G11C 16/3418

USPC ...................................................... 365/189.011
See application file for complete search history.

(56) References Cited

U.S. PATENT DOCUMENTS

| | | | | |
|---|---|---|---|---|
| 2018/0267708 A1* | 9/2018 | Shin | ......................... | G06F 3/061 |
| 2024/0419332 A1* | 12/2024 | Eliash | ................... | G06F 3/0613 |
| 2025/0336466 A1* | 10/2025 | Eliash | ................... | G11C 29/028 |

* cited by examiner

*Primary Examiner* — Ly D Pham
(74) *Attorney, Agent, or Firm* — JCIPRNET

(57) ABSTRACT

The disclosure provides a reading voltage management method and a storage device. The method includes: selecting a first physical unit from multiple physical units; dividing a first sub-physical unit in the first physical unit into a multiple information windows dedicated to storing temperature data related to a second physical unit, in which a total quantity of the information windows is the same as a total quantity of multiple sub-physical units in the second physical unit; receiving a read command from a host system; reading first temperature data related to the second sub-physical unit among the second physical unit from the first information window according to the read command; determining a first reading voltage level according to the first temperature data; and reading the target data from the second sub-physical unit based on the first reading voltage level to respond to the read command.

18 Claims, 6 Drawing Sheets

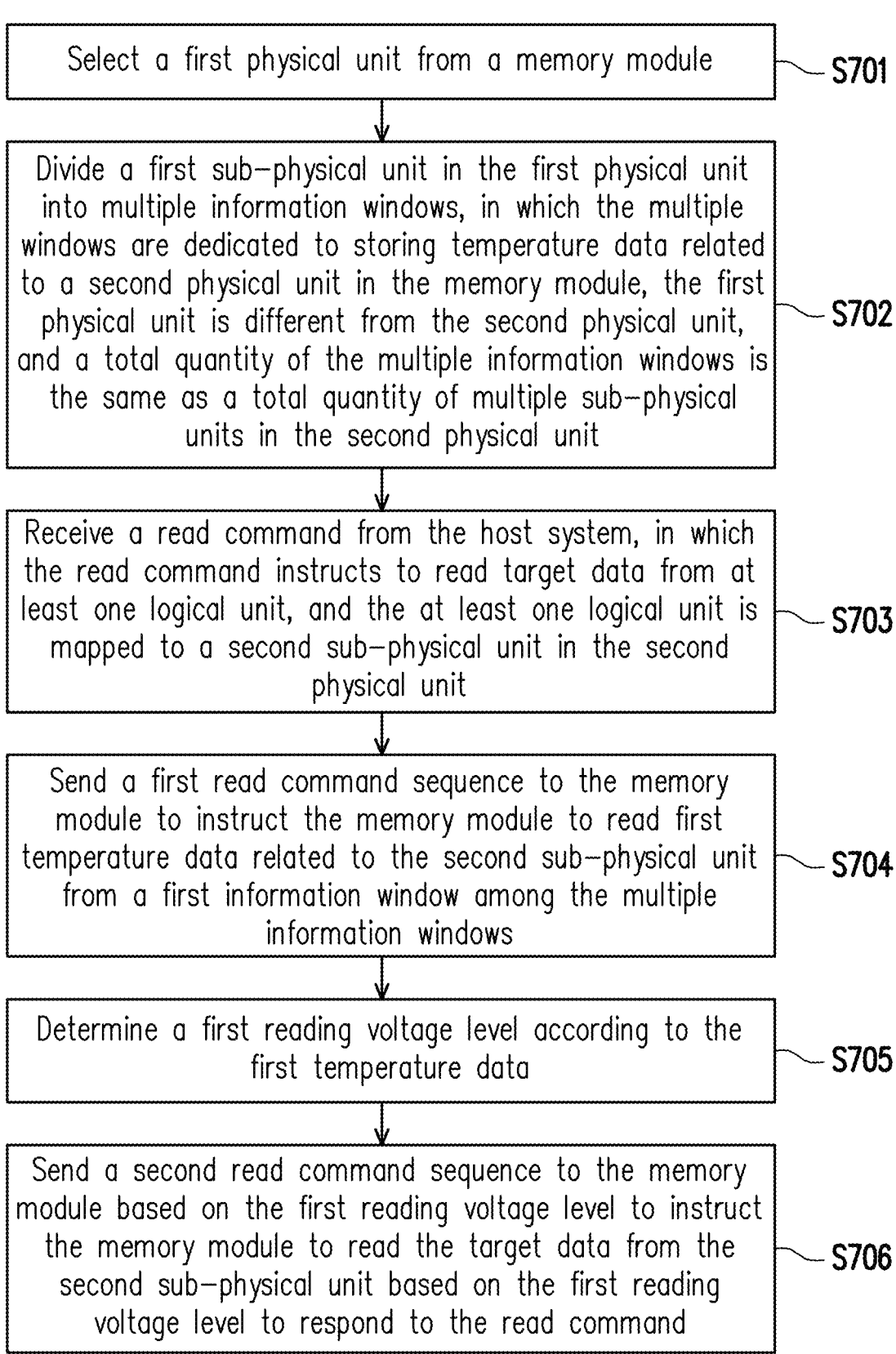

Select a first physical unit from a memory module ~ S701

Divide a first sub-physical unit in the first physical unit into multiple information windows, in which the multiple windows are dedicated to storing temperature data related to a second physical unit in the memory module, the first physical unit is different from the second physical unit, and a total quantity of the multiple information windows is the same as a total quantity of multiple sub-physical units in the second physical unit ~ S702

Receive a read command from the host system, in which the read command instructs to read target data from at least one logical unit, and the at least one logical unit is mapped to a second sub-physical unit in the second physical unit ~ S703

Send a first read command sequence to the memory module to instruct the memory module to read first temperature data related to the second sub-physical unit from a first information window among the multiple information windows ~ S704

Determine a first reading voltage level according to the first temperature data ~ S705

Send a second read command sequence to the memory module based on the first reading voltage level to instruct the memory module to read the target data from the second sub-physical unit based on the first reading voltage level to respond to the read command ~ S706

FIG. 7

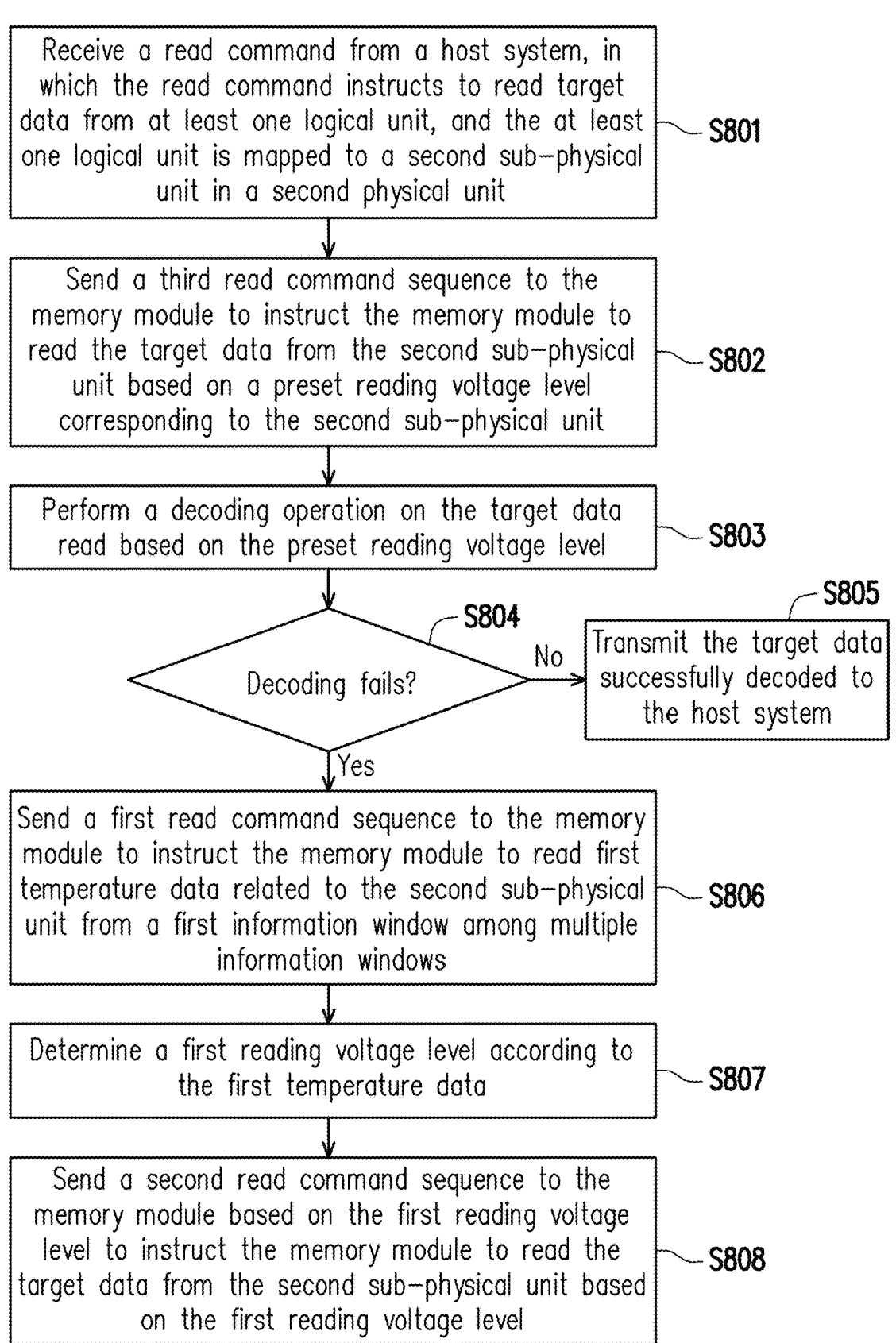

Receive a read command from a host system, in which the read command instructs to read target data from at least one logical unit, and the at least one logical unit is mapped to a second sub-physical unit in a second physical unit — S801

Send a third read command sequence to the memory module to instruct the memory module to read the target data from the second sub-physical unit based on a preset reading voltage level corresponding to the second sub-physical unit — S802

Perform a decoding operation on the target data read based on the preset reading voltage level — S803

S804 Decoding fails?

No → Transmit the target data successfully decoded to the host system — S805

Yes

Send a first read command sequence to the memory module to instruct the memory module to read first temperature data related to the second sub-physical unit from a first information window among multiple information windows — S806

Determine a first reading voltage level according to the first temperature data — S807

Send a second read command sequence to the memory module based on the first reading voltage level to instruct the memory module to read the target data from the second sub-physical unit based on the first reading voltage level — S808

FIG. 8

READING VOLTAGE MANAGEMENT METHOD AND STORAGE DEVICE

CROSS-REFERENCE TO RELATED APPLICATION

This application claims the priority benefit of China application serial no. 202410517907.9, filed on Apr. 26, 2024. The entirety of the above-mentioned patent application is hereby incorporated by reference herein and made a part of this specification.

BACKGROUND

Technical Field

The disclosure relates to a memory management technology, and particularly relates to a reading voltage management method and a storage device.

Description of Related Art

Flash memory is a non-volatile memory widely used in electronic devices such as memory cards, solid state drives, and portable multimedia players. The cells in the rewritable non-volatile memory module store data by injecting charge into the cells. When reading data, a reading voltage may be applied to a specific cell to read the data stored in the cell.

When the memory controller reads data from the rewritable non-volatile memory module according to a preset reading voltage, the memory controller may decode the data read to obtain the data to be read. However, as the operation and environmental conditions of the rewritable non-volatile memory module vary, the threshold voltage of the rewritable non-volatile memory module may also shift. In this case, there may be too many error bits in the data read using the preset reading voltage. Generally speaking, a memory controller finds out an optimal reading voltage by performing an optimal reading voltage tracking operation, and use the optimal reading voltage to perform reading to retrieve the data read and perform decoding.

In the optimal reading voltage tracking operation, the memory controller continuously monitors and records the optimal reading voltage of the memory module. However, the operation and environmental conditions (for example, temperature) when the storage device actually reads data may be different from the conditions when the optimal reading voltage was previously monitored. That is, as the operation and environmental conditions change and as time passes, the optimal reading voltage of the rewritable non-volatile memory module may shift again, so that the optimal reading voltage previously found is inaccurate. Therefore, if the previously found optimal reading voltage is directly used to read data, the performance of the read operation may be deteriorated.

SUMMARY

The disclosure provides a reading voltage management method and a storage device, which can improve the above-mentioned problem and enhance the efficiency of accessing data of the storage device.

An embodiment of the disclosure provides a reading voltage management method for a memory module, in which the memory module includes a plurality of physical units, and the reading voltage management method includes the following. A first physical unit is selected from the plurality of physical units. A first sub-physical unit in the first physical unit is divided into multiple information windows, in which the plurality of information windows are dedicated to storing temperature data related to a second physical unit among the plurality of physical units, the first physical unit is different from the second physical unit, and the total quantity of the plurality of information windows is the same as the total quantity of a plurality of sub-physical units in the second physical unit. A read command is received from a host system, in which the read command instructs to read target data from at least one logical unit, and the at least one logical unit is mapped to a second sub-physical unit in the second physical unit. A first read command sequence is sent to the memory module according to the read command to instruct the memory module to read first temperature data related to the second sub-physical unit from a first information window among the plurality of information windows. A first reading voltage level is determined according to the first temperature data. A second read command sequence is sent to the memory module based on the first reading voltage level to instruct the memory module to read the target data from the second sub-physical unit based on the first reading voltage level to respond to the read command.

An embodiment of the disclosure further provides a storage device, which includes a connection interface unit, a memory module, and a memory controller. The connection interface unit is used to connect to a host system. The memory controller is connected to the connection interface unit and the memory module. The memory module includes a plurality of physical units, and the memory controller is used to perform the following. A first physical unit is selected from the plurality of physical units. A first sub-physical unit in the first physical unit is divided into multiple information windows, in which the plurality of information windows are dedicated to storing temperature data related to a second physical unit among the plurality of physical units, the first physical unit is different from the second physical unit, and the total quantity of the plurality of information windows is the same as the total quantity of a plurality of sub-physical units in the second physical unit. A read command is received from a host system, in which the read command instructs to read target data from at least one logical unit, and the at least one logical unit is mapped to a second sub-physical unit in the second physical unit. A first read command sequence is sent to the memory module according to the read command to instruct the memory module to read first temperature data related to the second sub-physical unit from a first information window among the plurality of information windows. A first reading voltage level is determined according to the first temperature data. A second read command sequence is sent to the memory module based on the first reading voltage level to instruct the memory module to read the target data from the second sub-physical unit based on the first reading voltage level to respond to the read command.

BRIEF DESCRIPTION OF THE DRAWINGS

FIG. 7 is a flow chart of a reading voltage management method according to an embodiment of the disclosure.

FIG. 8 is a flow chart of the reading voltage management method according to an embodiment of the disclosure.

DESCRIPTION OF THE EMBODIMENTS

Figure 1:
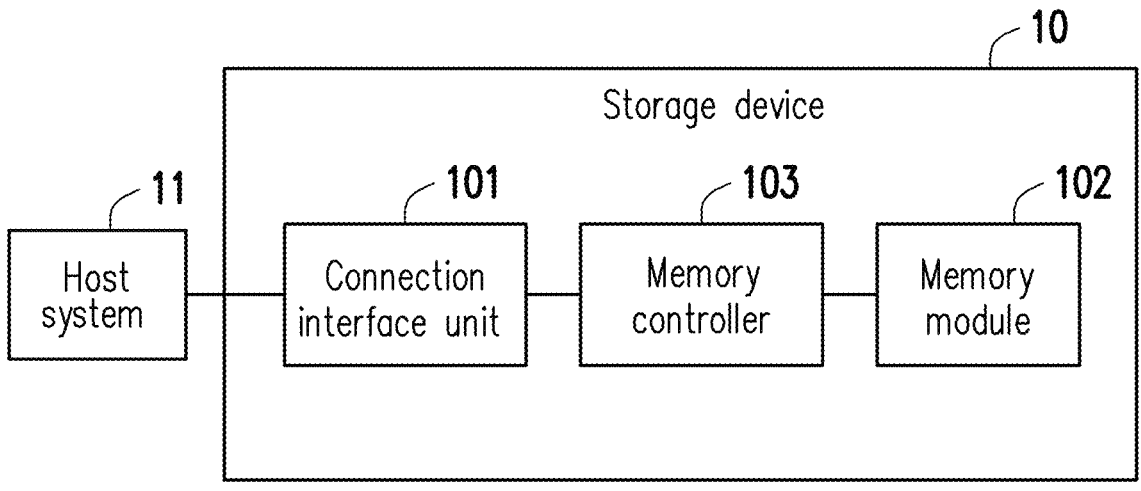
FIG. 1 is a schematic diagram of a storage device according to an embodiment of the disclosure.

Reference will now be made in detail to exemplary embodiments of the disclosure, and the embodiments are illustrated in the accompanying drawings. Whenever possible, the same reference numerals are used in the drawings and the description to refer to the same or similar parts.

FIG. 1 is a schematic diagram of a memory storage device according to an embodiment of the disclosure. Referring to FIG. 1, a data storage system includes a storage device 10 and a host system 11. The host system 11 may be any type of computer system, such as a smart phone, a tablet computer, a laptop computer, a desktop computer, an industrial computer, a game console, a server, or a vehicle-mounted computer, and the type of the host system 11 is not limited thereto.

The storage device 10 is connected to the host system 11 and is used to store data from the host system 11. For example, the storage device 10 may include a solid state drive, a USB flash drive, a memory card, or other types of non-volatile storage devices. The host system 11 may communicate with the storage device 10 via an embedded multi-media card (eMMC), universal flash storage (UFS), peripheral component interconnect express (PCI Express), non-volatile memory express (NVM express), serial advanced technology attachment (SATA), universal serial bus (USB), or other types of connection interface standards. Therefore, the host system 11 may store data to the storage device 10 and/or read data from the storage device 10.

The storage device 10 includes a connection interface unit 101, a memory module 102, and a memory controller 103. The connection interface unit 101 is used to connect the storage device 10 to the host system 11. For example, the connection interface unit 101 may support connection interface standards such as eMMC, UFS, PCI Express, NVM express, SATA, PCI Express, or USB. The storage device 10 may communicate (for example, exchange signals, commands, and/or data) with the host system 11 via the connection interface unit 101.

The memory module 102 is used to store data. The memory module 102 may include one or more rewritable non-volatile memory modules. Each rewritable non-volatile memory module may include one or more cell arrays. Cells in the cell array store data in the form of voltage (also referred to as a threshold voltage). For example, the memory module 102 may include a single level cell (SLC) NAND type flash memory module, a multi level cell (MLC) NAND type flash memory module, a triple level cell (TLC) NAND type flash memory module, a quad level cell (QLC) NAND type flash memory module, and/or other memory modules having the same or similar characteristics.

The memory controller 103 is connected to the connection interface unit 101 and the memory module 102. The memory controller 103 may be regarded as a control core of the storage device 10 and is used to control the storage device 10. For example, the memory controller 103 may be responsible for controlling and/or managing the entire or partial operation of the storage device 10. For example, the memory controller 103 may include a central processing unit (CPU), or other programmable general-purpose or special-purpose microprocessors, digital signal processors (DSP), programmable controllers, application specific integrated circuits (ASIC), programmable logic devices (PLD), or other similar devices or combinations of these devices. In an embodiment, the memory controller 103 includes a flash memory controller.

In an embodiment, the memory controller 103 may further include a buffer memory, a power management circuit, an encoding circuit, a decoding circuit, and/or other types of various circuit modules, and the disclosure is not limited thereto. The buffer memory is used to cache data. The power management circuit is used to manage the power of the storage device 10. The encoding circuit is used to encode data to be stored in the memory module 102 to generate an error correction code (and/or an error checking code). The decoding circuit is used to decode data read from the memory module 102 to correct possible errors in the data read. For example, the encoding circuit and/or decoding circuit may use various encoding/decoding algorithms such as low density parity check code (LDPC code), BCH code, Reed-Solomon code (RS code), and exclusive OR (XOR) code to encode and decode data.

The memory module 102 may receive a command sequence from the memory controller 103 and access the cell according to the command sequence. For example, when data is to be stored, the memory controller 103 may send a write command sequence to the memory module 102 to instruct the memory module 102 to store the data in a specific cell. When data is to be read, the memory controller 103 may send a read command sequence to the memory module 102 to instruct the memory module 102 to read data from a specific cell. When data is to be deleted, the memory controller 103 may send an erase command sequence to the memory module 102 to instruct the memory module 102 to erase the data stored in the specific cell. In addition, the memory controller 103 may also send other types of command sequences to the memory module 102 to instruct the memory module 102 to perform corresponding operations, and the disclosure is not limited thereto.

Figure 2:
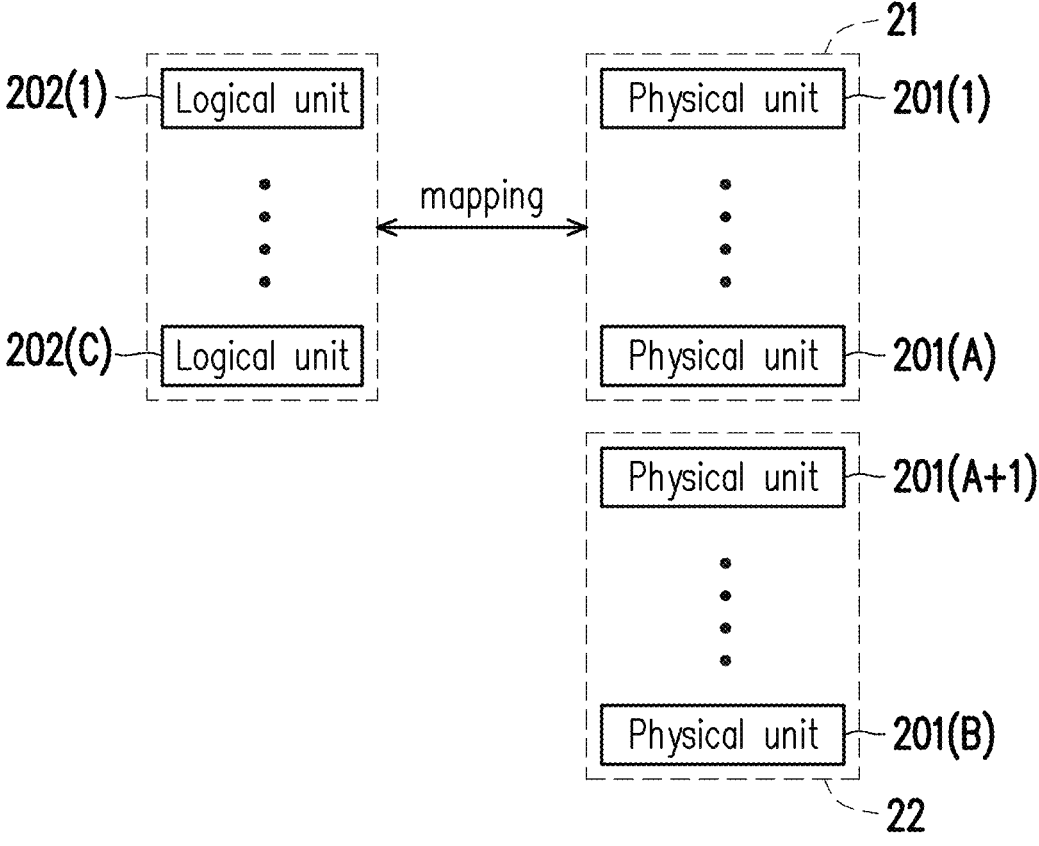
FIG. 2 is a schematic diagram of managing a memory module according to an embodiment of the disclosure.

FIG. 2 is a schematic diagram of managing a memory module according to an embodiment of the disclosure. Referring to FIG. 1 and FIG. 2, the memory module 102 includes a plurality of physical units 201(1) to 201(B). Each physical unit includes a plurality of cells and is used to store data in a non-volatile manner.

In an embodiment, a physical unit may include one or more physical erase units. A physical erase unit may include a plurality of physical programming units. For example, a physical programming unit may include multiple physical sectors. For example, the data capacity of a physical sector may be 512 bytes (B), and a physical programming unit may include 8 physical sectors. However, the data capacity of a physical sector and/or the total quantity of physical sectors included in a physical programming unit may be adjusted according to practical requirements, and the disclosure is not limited thereto. In an embodiment, a physical programming unit may be regarded as a physical page. For example, the data capacity of a physical programming unit may be 4 kilobytes (4 KB), and the disclosure is not limited thereto.

In an embodiment, a physical programming unit is the smallest unit of synchronously writing data in the memory module 102. For example, when a programming operation is performed on a physical programming unit to write data into the physical programming unit, a plurality of cells in the physical programming unit may be synchronously programmed to store corresponding data. For example, when programming a physical programming unit, a writing voltage may be applied to the physical programming unit to change a threshold voltage of at least part of the cells in the physical programming unit. The threshold voltage of each cell may reflect the bit data stored in the cell. In the following embodiments, a physical programming unit is also referred to as a sub-physical unit.

In an embodiment, multiple cells in the same physical erasing unit may be synchronously erased. For example, when performing an erase operation on a physical erase unit, an erasing voltage may be applied to a plurality of physical programming units in the physical erase unit to change the threshold voltage of at least part of the cells in the physical programming units and clear the bit data stored in each cell in the physical programming units.

In an embodiment, the memory controller 103 may logically associate physical units 201(1) to 201(A) with a data area 21 and associate physical units 201(A+1) to 201(B) with a spare area 22. The physical units 201(1) to 201(A) in the data area 21 are used to store data (also referred to as user data) from the host system 11. For example, each physical unit in the data area 21 may store valid data and/or invalid data. On the other hand, the physical units 201(A+1) to 201(B) in the spare area 22 do not store data.

In an embodiment, if a physical unit does not store valid data, then the physical unit may be associated with the spare area 22. In an embodiment, the spare area 22 is also referred to as a free pool. In addition, the physical unit associated with the spare area 22 may be erased to clear the data in the physical unit.

In an embodiment, when data (that is, the user data) from the host system 11 needs to be stored, the memory controller 103 may select one or more physical units from the spare area 22 and instruct the memory module 102 to store the data from the host system 11 in the physical units selected. At the same time, the physical unit selected may be associated with the data area 21.

In an embodiment, the memory controller 103 may configure a plurality of logical units 202(1) to 202(C) to map the physical units 201(1) to 201(A) in the data area 21. For example, a logical unit may correspond to a logical block address (LBA) or other logical management units. A logical unit may be mapped to one or more physical units in the data area 21.

In an embodiment, if a certain physical unit is currently mapped by any logical unit, then the memory controller 103 may determine that data currently stored in the physical unit includes valid data. In contrast, if a physical unit is not currently mapped by any logical unit, then the memory controller 103 may determine that the physical unit does not currently store any valid data (and/or the data in the physical unit are all invalid data).

In an embodiment, the memory controller 103 may record a mapping relationship between the logical unit and the physical unit in a logical-to-physical mapping table. When receiving an access command (such as a read command, a write command, a delete command, or other types of commands) from the host system 11, the memory controller 103 may instruct the memory module 102 to perform corresponding operation actions according to information in the logical-to-physical mapping table.

In an embodiment, the memory controller 103 may select a physical unit (also referred to as a first physical unit) from the spare area 22. The memory controller 103 may divide a specific sub-physical unit (also referred to as a first sub-physical unit) in the first physical unit into a plurality of information windows. For example, each information window may be used to store data of a preset length. The memory controller 103 may configure the information windows to be dedicated to store temperature data related to another physical unit (also referred to as a second physical unit) in the memory module 102.

It should be noted that the first physical unit is different from the second physical unit. That is, the first physical unit and the second physical unit refer to two different physical units in the memory module 102 respectively. In addition, the total quantity of the plurality of information windows may be the same as the total quantity of the plurality of sub-physical units in the second physical unit. For example, assuming that the total quantity of the sub-physical units in the second physical unit is N, then the total quantity of the information windows in the first sub-physical unit is also N, and N may be any integer greater than 1. In an embodiment, the remaining sub-physical units in the first physical unit may also be used to store temperature data related to the remaining physical units in the memory module 102, and the details will not be repeated here.

In an embodiment, the memory controller 103 may configure each information window of the first sub-physical unit to be dedicated to store temperature data related to a specific sub-physical unit in the second physical unit. For example, temperature data (also referred to as first temperature data) stored in an information window (also referred to as a first information window) of the first sub-physical unit may reflect a temperature value of the memory module 102 measured when a data writing operation (that is, a programming operation) is performed on a specific sub-physical unit (also referred to as a second sub-physical unit) in the second physical unit to store data.

In an embodiment, the memory controller 103 may send a write command sequence (also referred to as a first write command sequence) to the memory module 102 to instruct the memory module 102 to store data (also referred to as target data) in the second sub-physical unit. For example, the target data may include data stored (that is, new data) as instructed by the host system 11 or data collected (that is, old data) from the memory module 102 through a data consolidation operation performed within the storage device 10. For example, the data consolidation operation may include data consolidation actions including data reading and moving such as garbage collection (GC) or wear leveling (WL).

In an embodiment, when performing a data writing operation on the second sub-physical unit to store data (that is, the target data), the memory controller 103 may measure temperature of the surface or inside of the memory module 102 via one or more temperature sensors disposed inside the storage device 10. Then, the memory controller 103 may record the temperature data related to the second sub-physical unit (that is, the first temperature data) according to the temperature value of the memory module 102 currently measured by the temperature sensor.

In an embodiment, when the second physical unit is fully written (that is, all sub-physical units in the second physical unit have been written with data), the memory controller 103 may write the temperature data related to the second physical unit into the first sub-physical unit. For example, after the second physical unit is fully written, the memory controller 103 may send a write command sequence (also referred to as a second write command sequence) to the memory module 102 to instruct the memory module 102 to store the first temperature data in the first information window of the first sub-physical unit. Similarly, more second write command sequences may be used to instruct the memory module 102 to store temperature data related to each sub-physical unit in the second physical unit in a corresponding information window in the first sub-physical unit.

In an embodiment, the memory controller 103 may further perform a programming operation (that is, a data writing operation) on the first physical subunit (and the remaining sub-physical units in the first physical unit) in a single level cell (SLC) or pseudo SLC (pSLC) programming mode to store the temperature data. In this way, in addition to improving the programming speed (that is, the writing speed) of the sub-physical unit dedicated to storing the temperature data, the storage capability of the temperature data can also be effectively improved.

Figure 3:
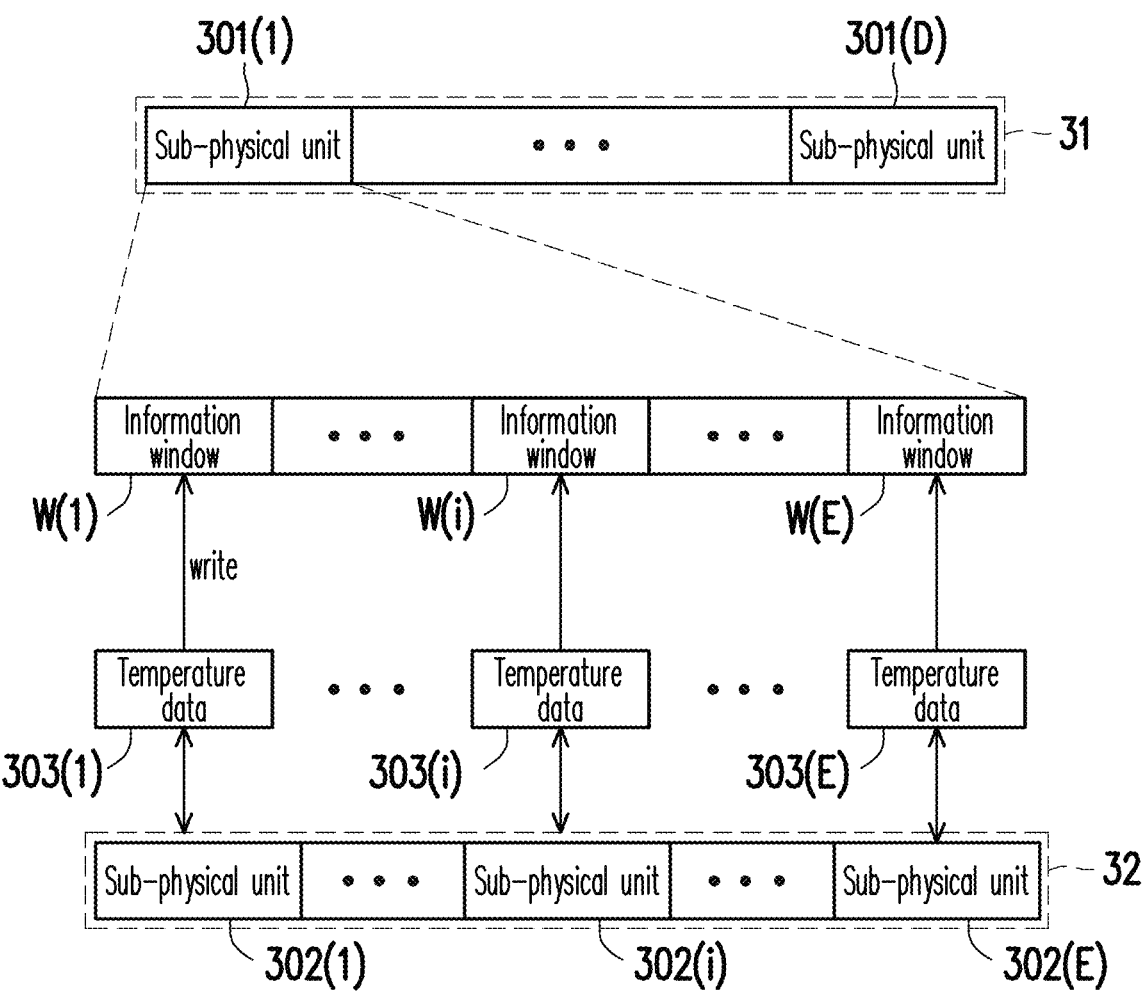
FIG. 3 is a schematic diagram of a first sub-physical unit being divided into a plurality of information windows to store temperature data related to a second physical unit according to an embodiment of the disclosure.

FIG. 3 is a schematic diagram of a first sub-physical unit being divided into a plurality of information windows to store temperature data related to a second physical unit according to an embodiment of the disclosure.

Referring to FIG. 3, it is assumed that a physical unit 31 is the first physical unit, and a physical unit 32 is the second physical unit. The physical unit 31 includes a plurality of sub-physical units 301(1) to 301(D). The physical unit 32 includes a plurality of sub-physical units 302(1) to 302(E). The total quantity of the sub-physical units 301(1) to 301(D) may be the same as or different from the total quantity of the sub-physical units 302(1) to 302(E).

In an embodiment, the memory controller 103 may divide a sub-physical unit 301(1) (that is, the first sub-physical unit) in the physical unit 31 into a plurality of information windows W(1) to W(E). The information windows W(1) to W(E) may be dedicated to storing temperature data 303(1) to 303(E) related to the sub-physical units 302(1) to 302(E) in the physical unit 32. For example, the temperature data 303(i) may reflect the temperature value of the memory module 102 measured when a data writing operation is performed on the sub-physical unit 302(i) (that is, the second sub-physical unit) to store data (that is, the target data). The value of i is from 1 to E. Similarly, the temperature data 303(1) to 303(E) may respectively reflect the temperature values of the memory module 102 respectively measured when data writing operations are respectively performed on the sub-physical units 302(1) to 302(E) to store data.

In an embodiment, after the physical unit 32 is fully written (that is, the sub-physical units 302(1) to 302(E) are all written with data), the memory controller 103 may instruct the memory module 102 to synchronously write the temperature data 303(1) to 303(E) into the information windows W(1) to W(E). Afterward, the memory controller 103 may perform a data reading operation on the sub-physical unit 301(1) to obtain the temperature data 303(i) related to the sub-physical unit 302(i).

In an embodiment, when performing a data writing operation on the second sub-physical unit to store the target data, the memory controller 103 may obtain the first temperature data through the temperature sensor. After obtaining the first temperature data, the memory controller 103 may send a write command sequence (also referred to as a third write command sequence) to the memory module 102 to instruct the memory module 102 to store the target data in the data area of the second sub-physical unit and to synchronously store the first temperature data in the spare area of the second sub-physical unit. In this way, the first temperature data related to the second sub-physical unit may be synchronously stored in the second sub-physical unit with the target data for quick access later.

Figure 4:
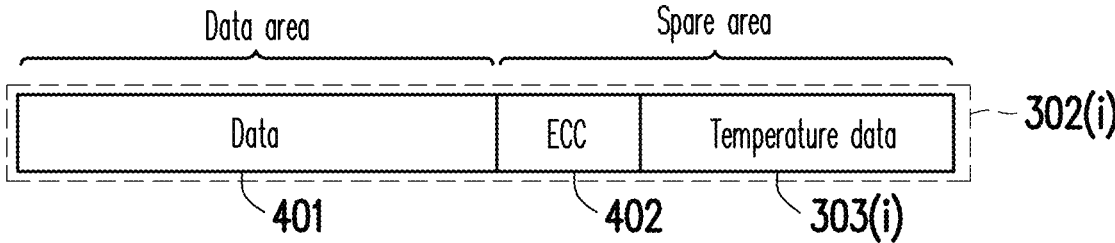
FIG. 4 is a schematic diagram of synchronously storing target data and first temperature data in a second sub-physical unit according to an embodiment of the disclosure.

FIG. 4 is a schematic diagram showing of synchronously storing the target data and the first temperature data in the second sub-physical unit according to an embodiment of the disclosure. Referring to FIG. 4, in an embodiment, it is assumed that the temperature data 303(i) (that is, the first temperature data) may reflect the temperature value of the memory module 102 measured when a data writing operation is performed on the sub-physical unit 302(i) (that is, the second sub-physical unit) to store data 401 (that is, the target data). When the data 401 is stored in the data area of the sub-physical unit 302(i), the temperature data 303(i) may be synchronously stored in the spare area of the sub-physical unit 302(i).

In an embodiment, the spare area in the sub-physical unit 302(i) may also be used to store error correction data 402 that may be used to protect the data 401. For example, the error correction data 402 may be generated by encoding the data 401. For example, the error correction data 402 may include an error correction code (ECC) or other encoded data generated by encoding the data 401. When reading data 401 from the sub-physical unit 302(i), the error correction data 402 may be used to correct or detect error bits in the data 401 read from the sub-physical unit 302(i). Afterward, during the period in which the data 401 is read from the data area in the sub-physical unit 302(i) through performing a data reading operation on the sub-physical unit 302(i), the memory controller 103 may synchronously read the temperature data 303(i) related to the sub-physical unit 302(i) from the spare area in the sub-physical unit 302(i). In this way, the efficiency of reading the temperature data can be further improved.

In an embodiment, the data area in the sub-physical unit 302(i) is also referred to as a data bit area, and the spare area in the sub-physical unit 302(i) is also referred to as a redundant bit area. In an embodiment, the spare area in the sub-physical unit 302(i) may also be used to store other types of management data, and the disclosure is not limited thereto.

In an embodiment, the remaining sub-physical units (for example, the sub-physical units 301(2) to 301(D)) in the physical unit 31 may also be used to store temperature data related to the remaining physical units in the memory module 102. For relevant operation details, reference may be made to the description of the embodiment in FIG. 3, so details will not be repeated here. In addition, the remaining sub-physical units in the physical unit 32 (for example, the sub-physical units 302(2) to 302(E)) may also be used to store respective temperature data. For relevant operation details, reference may be made to the description of the embodiment in FIG. 4, so details will not be repeated here.

In an embodiment, the memory controller 103 may store the temperature data via binary bit data. Taking FIG. 3 as an example, assuming that the temperature data 303(1) reflects that the temperature value of the memory module 102 measured when a data writing operation is performed on the sub-physical unit 302(1) to store data is 70 degrees, then the temperature data 303(1) may be recorded as "11000110". Alternatively, assuming that the temperature data 303(2) reflects that the temperature value of the memory module 102 measured when a data writing operation is performed on the sub-physical unit 302(2) to store data is 25 degrees, then the temperature data 303(2) may be recorded as "111001". Furthermore, assuming that the temperature data 303(3)

reflects the temperature value of the memory module 102 measured when a data writing operation is performed on the sub-physical unit 302(3) to store data is-10 degrees (that is, minus 10 degrees), then the temperature data 303(3) may be recorded as "01010". It should be noted that in the above examples, the first bit in the temperature data 303(1) and 303(2) is "1" to indicate that the corresponding temperature value is a positive value (for example, +70 degrees and +25 degrees), and the first bit in the temperature data 303(3) is "0", which may be used to indicate that the corresponding temperature value is a negative value (for example, –10 degrees). However, the recording method of the temperature data may also be adjusted according to practical requirements, and the disclosure is not limited thereto.

In an embodiment, the memory controller 103 may receive a read command from the host system 11. The read command instructs to read data from at least one logical unit, and the at least one logical unit is mapped to the second sub-physical unit in the second physical unit. In other words, the read command instructs to read the data previously stored in the second sub-physical unit (that is, the target data).

In an embodiment, according to the read command, the memory controller 103 may send a read command sequence (also referred to as a first read command sequence) to the memory module 102 to instruct the memory module 102 to read the temperature data (that is, the first temperature data) related to the second sub-physical unit from the specific information window (that is, the first information window) in the first sub-physical unit. The memory controller 103 may determine a reading voltage level (also referred to as a first reading voltage level) according to the first temperature data. Then, the memory controller 103 may send a read command sequence (also referred to as a second read command sequence) to the memory module 102 based on the first reading voltage level to instruct the memory module 102 to read the target data from the second sub-physical unit based on the first reading voltage level to respond to the read command.

In an embodiment, after reading the target data, if the memory controller 103 can successfully decode the target data (that is, all errors in the target data have been corrected), then the memory controller 103 may transmit the target data successfully decoded to the host system 11 to respond to the read command. However, if the decoding of the target data fails, then the memory controller 103 may continue to perform error processing for the read command (for example, changing the reading voltage level and/or changing the decoding mode).

In an embodiment, the voltage value of the first reading voltage level may be affected by the first temperature data. For example, according to different first temperature data, the memory controller 103 may determine the voltage value of the first reading voltage level to be different voltage values. In an embodiment, the memory controller 103 may query at least one voltage information table grid according to the first temperature data and determine the first reading voltage level according to the query result.

In an embodiment, when the target data is to be read from the second sub-physical unit, the memory controller 103 may also obtain another temperature data (also referred to as second temperature data) through the temperature sensor. The second temperature data may reflect the current temperature value of the memory module 102. In other words, the current temperature value may reflect the temperature value of the memory module 102 measured when a data reading operation is performed on the second sub-physical unit to read the target data.

In an embodiment, the memory controller 103 may select a specific voltage information table grid (also referred to as a first voltage information table grid) from a plurality of candidate voltage information table grids according to the first temperature data and the second temperature data. Each candidate voltage information table grid is used to record customized voltage management information. Then, the memory controller 103 may determine the first reading voltage level according to the voltage management information in the first voltage information table grid.

In an embodiment, the plurality of candidate voltage information table grids include four voltage information table grids. For example, the four voltage information table grids are also referred to as a first candidate voltage information table grid, a second candidate voltage information table grid, a third candidate voltage information table grid, and a fourth candidate voltage information table grid. The first candidate voltage information table grid is dedicated to recording voltage management information corresponding to a combination of first category writing temperature data and first category reading temperature data (also referred to as first category voltage management information). The second candidate voltage information table grid is dedicated to recording voltage management information corresponding to a combination of the first category writing temperature data and second category reading temperature data (also referred to as second category voltage management information). The third candidate voltage information table grid is dedicated to recording voltage management information corresponding to a combination of second category writing temperature data and the first category reading temperature data (also referred to as third category voltage management information). The fourth candidate voltage information table grid is dedicated to recording voltage management information corresponding to a combination of the second category writing temperature data and the second category reading temperature data (also referred to as fourth category voltage management information).

In an embodiment, the first category writing temperature data includes temperature data reflecting that the temperature value of the memory module 102 measured when a data writing operation is performed on a specific sub-physical unit is higher than one or more temperature upper limits (also referred to as a first temperature upper limit). In an embodiment, the second category writing temperature data includes temperature data reflecting that the temperature value of the memory module 102 measured when a data writing operation is performed on a specific sub-physical unit is lower than one or more temperature lower limits (also referred to as a first temperature lower limit). The first upper temperature limit is higher than the first lower temperature limit.

In an embodiment, the first category reading temperature data includes temperature data reflecting that the temperature value of the memory module 102 measured when a data reading operation is performed on a specific sub-physical unit is higher than one or more temperature upper limits (also referred to as a second temperature upper limit). In an embodiment, the second category reading temperature data includes temperature data reflecting that the temperature value of the memory module 102 measured when a data reading operation is performed on a specific sub-physical unit is lower than one or more temperature lower limits (also referred to as a second temperature lower limit). The second temperature upper limit is higher than the second temperature lower limit. The first upper temperature limit may be the same as or different from the second upper temperature limit. The first lower temperature limit may be the same as or different from the second lower temperature limit.

In other words, the voltage management information recorded in the first candidate voltage information table grid is beneficial to, when both the data writing temperature and the data reading temperature are relatively high (for example, the data writing temperature is higher than the first temperature upper limit and the data reading temperature is higher than the second temperature upper limit), generating a first reading voltage level estimated to improve efficiency of reading data (for example, reduce the quantity of error bits in the target data read). The voltage management information recorded in the second candidate voltage information table grid is beneficial to, when the data writing temperature is relatively high (for example, the data writing temperature is higher than the first temperature upper limit) and the data reading temperature is relatively low (for example, the data reading temperature is lower than the second temperature lower limit), generating a first reading voltage level estimated to improve efficiency of reading data. The voltage management information recorded in the third candidate voltage information table grid is beneficial to, when the data writing temperature is relatively low (for example, the data writing temperature is lower than the first temperature limit) and the data reading temperature is relatively high (for example, the data reading temperature is higher than the second temperature limit), generating a first reading voltage level estimated to improve efficiency of reading data. The voltage management information recorded in the fourth candidate voltage information table grid is beneficial to, when both the data writing temperature and the data reading temperature are relatively low (for example, the data writing temperature is lower than the first temperature lower limit and the data reading temperature is lower than the second temperature lower limit), generating a first reading voltage level estimated to improve efficiency of reading data.

In an embodiment, the memory controller 103 may determine whether the first temperature data belongs to the first category writing temperature data or the second category writing temperature data. For example, the memory controller 103 may determine whether the temperature value reflected by the first temperature data is higher than the temperature value corresponding to the first category writing temperature data (that is, the first temperature upper limit). If the temperature value reflected by the first temperature data is higher than the temperature value corresponding to the first category writing temperature data, then the memory controller 103 may determine that the first temperature data belongs to the first category writing temperature data. However, if the temperature value reflected by the first temperature data is lower than the temperature value corresponding to the second category writing temperature data (that is, the first temperature lower limit), then the memory controller 103 may determine that the first temperature data belongs to the second category writing temperature data.

In an embodiment, the memory controller 103 may determine whether the second temperature data belongs to the first category reading temperature data or the second category reading temperature data. For example, the memory controller 103 may determine whether the temperature value reflected by the second temperature data is higher than the temperature value corresponding to the first temperature data read (that is, the second temperature upper limit). If the temperature value reflected by the second temperature data is higher than the temperature value corresponding to the first category reading temperature data, then the memory controller 103 may determine that the second temperature data belongs to the first category reading temperature data. However, if the temperature value reflected by the second temperature data is lower than the temperature value corresponding to the second category reading temperature data (that is, the second temperature lower limit), then the memory controller 103 may determine that the second temperature data belongs to the second category reading temperature data.

In an embodiment, if the first temperature data belongs to the first category writing temperature data and the second temperature data belongs to the first category reading temperature data, then the memory controller 103 may select the first candidate voltage information table grid as the first voltage information table grid. In an embodiment, if the first temperature data belongs to the first category writing temperature data and the second temperature data belongs to the second category reading temperature data, then the memory controller 103 may select the second candidate voltage information table grid as the first voltage information table grid. In an embodiment, if the first temperature data belongs to the second category writing temperature data and the second temperature data belongs to the first category reading temperature data, then the memory controller 103 may select the third candidate voltage information table grid as the first voltage information table grid. In an embodiment, if the first temperature data belongs to the second category writing temperature data and the second temperature data belongs to the second category reading temperature data, then the memory controller 103 may select the fourth candidate voltage information table grid as the first voltage information table grid. Then, the memory controller 103 may determine the first reading voltage level (for example, determine or adjust the voltage value of the first reading voltage level) according to the voltage management information recorded in the first voltage information table grid.

Figure 5:
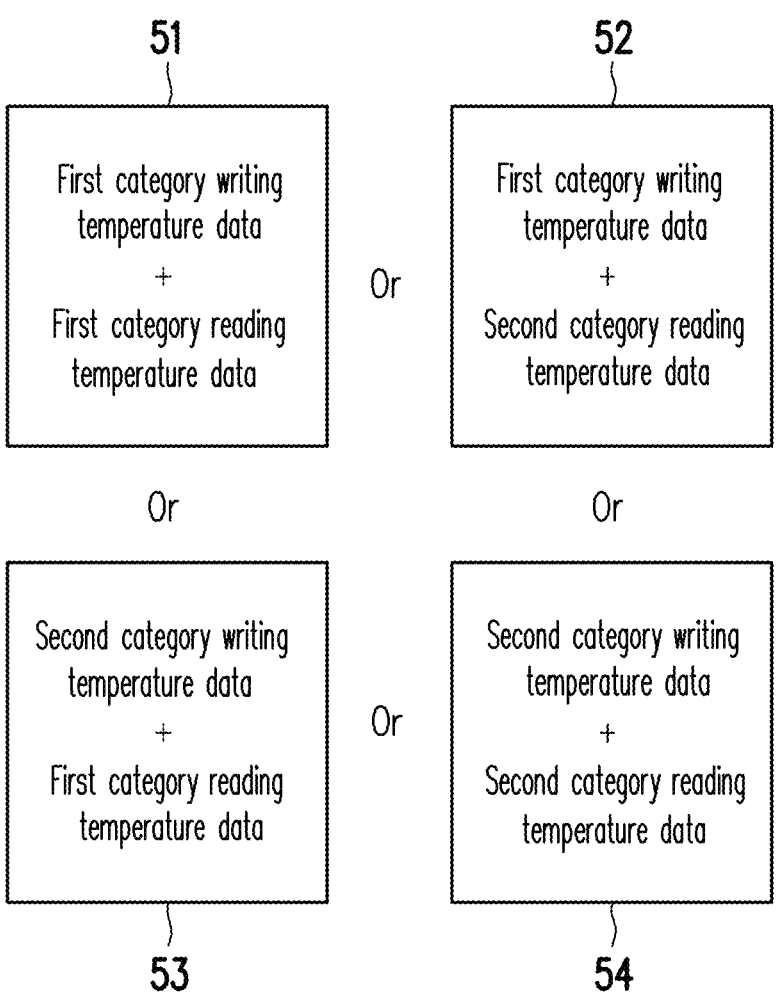
FIG. 5 is a schematic diagram of multiple candidate voltage information table grids according to an embodiment of the disclosure.

FIG. 5 is a schematic diagram of a plurality of candidate voltage information table grids according to an embodiment of the disclosure. Referring to FIG. 5, it is assumed that voltage information table grids 51 to 54 are respectively the first candidate voltage information table grid, the second candidate voltage information table grid, the third candidate voltage information table grid, and the fourth candidate voltage information table grid. In the first case, when the target data is to be read from the second sub-physical unit, if the first temperature data and the second temperature data reflect that the reading temperature and the writing temperature for the target data are both relatively high, then the memory controller 103 may set the voltage information table grid 51 as the first voltage information table grid and determine the first reading voltage level currently used for reading the target data from the second sub-physical unit according to the voltage management information in the voltage information table grid 51. In this way, the efficiency of reading data in an operation environment of high temperature writing combined with high temperature reading can be improved.

In the second case, when the target data is to be read from the second sub-physical unit, if the first temperature data and the second temperature data reflect that the reading temperature for the target data is relatively high, but the reading temperature for the target data is relatively low, then the memory controller 103 may set the voltage information table grid 52 as the first voltage information table grid and determine the first reading voltage level currently used for reading the target data from the second sub-physical unit according to the voltage management information in the voltage information table grid 52. In this way, the efficiency of reading data in an operation environment of high temperature writing combined with low temperature reading can be improved.

In the third case, when the target data is to be read from the second sub-physical unit, if the first temperature data and the second temperature data reflect that the reading temperature for the target data is relatively low, but the writing temperature is relatively high, then the memory controller 103 may set the voltage information table grid 53 as the first voltage information table grid and determine the first reading voltage level currently used for reading the target data from the second sub-physical unit according to the voltage management information in the voltage information table grid 53. In this way, the efficiency of reading data in an operation environment of low temperature writing combined with high temperature reading can be improved.

In the fourth case, when the target data is to be read from the second sub-physical unit, if the first temperature data and the second temperature data reflect that the reading temperature and the writing temperature for the target data are both relatively low, then the memory controller 103 may set the voltage information table grid 54 as the first voltage information table grid and determine the first reading voltage level currently used for reading the target data from the second sub-physical unit according to the voltage management information in the voltage information table grid 54. In this way, the efficiency of reading data in an operation environment of low temperature writing combined with low temperature reading can be improved.

Figure 6:
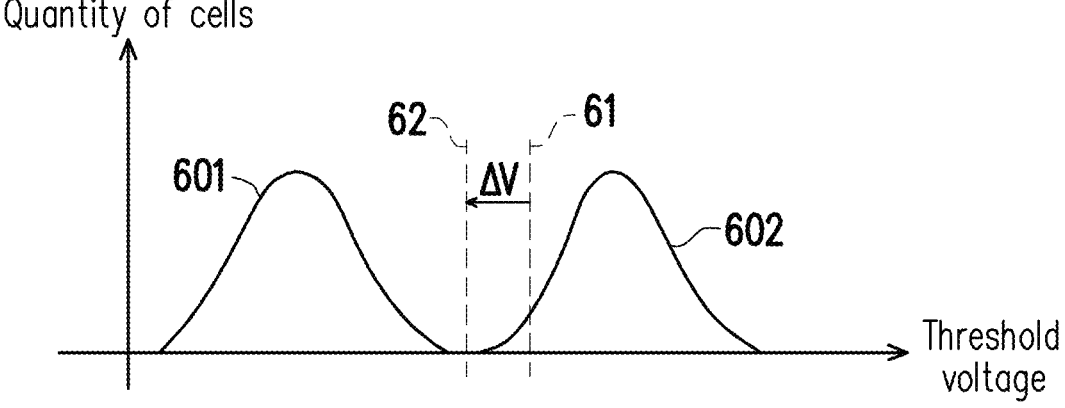
FIG. 6 is a schematic diagram of determining a first reading voltage level according to an embodiment of the disclosure.

FIG. 6 is a schematic diagram of determining the first reading voltage level according to an embodiment of the disclosure. Referring to FIG. 6, in an embodiment, it is assumed that the threshold voltage distribution of the plurality of cells in the second sub-unit includes statuses 601 and 602, for example, the status 601 corresponds to a first bit (for example, a bit "1"), and the status 602 corresponds to a second bit (for example, a bit "0"). It should be noted that the first bit and the second bit may be set according to practical requirements, and the disclosure is not limited thereto. In addition, a voltage level 61 is used to represent a preset reading voltage level corresponding to the second sub-physical unit.

In general, the memory module 102 uses the voltage level 61 to read data (that is, the target data) from the second sub-physical unit. For example, after applying the voltage level 61 to the second sub-physical unit, if a certain cell in the second sub-unit may be turned on by the voltage level 61 (for example, the threshold voltage of the cell is lower than the voltage level 61), then the memory module 102 may return the first bit to the memory controller 103. However, if the certain cell in the second sub-unit is not turned on by the voltage level 61 (for example, the threshold voltage of the cell is higher than the voltage level 61), then the memory module 102 may return the second bit to the memory controller 103.

In some situations (for example, when the writing temperature and/or reading temperature for the second sub-unit changes drastically), the relative voltage position between the threshold voltage distribution of the plurality of cells in the second sub-unit and the voltage level 61 may shift significantly, as shown in FIG. 6. At this time, if the voltage level 61 (that is, the preset reading voltage level corresponding to the second sub-physical unit) is continuously used to read the target data from the second sub-physical unit, then the target data read may contain a large quantity of error bits. The error bits may reduce the decoding speed of the memory controller 103 for the target data. In more serious cases, the error bits may even cause the memory controller 103 to be unable to successfully decode the target data, thereby errors in reading and decoding the target data are caused.

In an embodiment, according to the first voltage information table grid selected, the memory controller 103 may determine the voltage level 62 (that is, the first reading voltage level). For example, there is a voltage difference $\Delta V$ between the voltage levels 62 and 61. Compared with using the voltage level 61, when the memory module 102 uses the voltage level 62 to perform data reading operation on the second sub-physical unit, target data with significantly fewer error bits can be read, thereby the efficiency of reading the target data is effectively improved.

In an embodiment, in each candidate voltage information table grid, a plurality of combinations of the first temperature data and the second temperature data and voltage management information corresponding to each combination of the first temperature data and the second temperature data may be recorded in advance. After selecting the first voltage information table grid from the plurality of candidate voltage information table grids, according to the combination of the first temperature data and the second temperature data, the memory controller 103 may select matching voltage management information from the first voltage information table grid selected. Then, the memory controller 103 may determine the first reading voltage level (for example, the voltage level 62 in FIG. 6) according to the voltage management information.

In an embodiment, if the first temperature data does not belong to the first category writing temperature data and does not belong to the second category writing temperature data, or if the second temperature data does not belong to the first category reading temperature data and does not belong to the second category reading temperature data, then the memory controller 103 may determine the first reading voltage level through a backup voltage adjustment mechanism. For example, the backup voltage adjustment mechanism may include querying one or more voltage information table grids (also referred to as preset voltage information table grids) provided by the manufacturer of the storage device 10 when the storage device 10 is shipped out of the factory, so as to determine the first reading voltage level according to information in the preset voltage information table grids. It should be noted that, compared with the four categories of candidate voltage information table grids, the preset voltage information table grid cannot provide corresponding voltage management information for a specific operation environment (especially temperature change) to improve the efficiency of reading data when using the first reading voltage level to read the target data in the future.

In an embodiment, before sending the first read command sequence, the memory controller 103 may further send a read command sequence (also referred to as a third read command sequence) to the memory module 102 according to the read command to instruct the memory module 102 to read the target data from the second sub-physical unit based on the preset reading voltage level (for example, the voltage level 61 in FIG. 6) corresponding to the second sub-physical unit. The memory controller 103 may perform a decoding operation on the target data read based on the preset reading voltage level to attempt to correct error bits in the target data. If the target data can be decoded successfully (that is, all error bits in the target data have been corrected), then the memory controller 103 may transmit the target data successfully decoded back to the host system 11 to respond to the read command. However, if the target data cannot be decoded successfully (that is, the decoding of the target data fails), then the memory controller 103 may send the first read command sequence to the memory module 102 to read the first temperature data. Then, the memory controller 103 may determine the first reading voltage level according to the first temperature data and send the second read command sequence to the memory module 102 based on the first reading voltage level. The relevant operation descriptions have been illustrated above, so details will not be repeated here.

In an embodiment, in a pre-operation, the memory controller 103 may detect the bit error rate (BER) of data read from the memory module 102 using a plurality of candidate reading voltage levels when the memory module 102 or the storage device 10 is placed in different temperature environments. The memory controller 103 may determine the best candidate reading voltage level under a specific temperature environment according to the bit error rate. For example, compared with other candidate reading voltage levels, under a specific temperature environment, the best candidate reading voltage level may be used to read data with the lowest bit error rate from the memory module 102. Then, the candidate reading voltage level may record the voltage management information related to the best candidate reading voltage level in the corresponding candidate voltage information table grid for subsequent query.

In an embodiment, in the pre-operation, the memory module 102 or the storage device 10 is placed in a temperature-controlled box and the ambient temperature of the memory module 102 or the storage device 10 is controlled, and the memory controller 103 may detect the bit error rate (BER) of the data read from the memory module 102 using the plurality of candidate reading voltage levels under different operation conditions (for example, writing data to the memory module 102 under the first temperature status and reading data from the memory module 102 under the second temperature status). Then, the memory controller 103 may determine the best candidate reading voltage level to be used when reading the data from the memory module 102 at the second temperature status after writing the data to the memory module 102 at the first temperature status according to the bit error rate. For example, compared with other candidate reading voltage levels, after writing data to the memory module 102 at the first temperature status, when reading the data from the memory module 102 at the second temperature status, data with the lowest bit error rate (or the least total quantity of error bits) can be read from the memory module 102 using the best candidate reading voltage level. Then, the candidate reading voltage level may establish the multiple candidate voltage information table grids according to the best candidate reading voltage level for subsequent query.

In an embodiment, for a specific combination of the first temperature data and the second temperature data (for example, the writing temperature is 25 degrees and the reading temperature is 70 degrees), the memory controller 103 may record the decoding success rates of the target data read from the second sub-physical unit at multiple reading voltage levels (including the first reading voltage level) used in the past and sort the reading voltage levels according to the decoding success rates. For example, at different time points in the past, for a specific combination of the first temperature data and the second temperature data (for example, the writing temperature is 25 degrees and the reading temperature is 70 degrees), the reading voltage levels were used to read the target data from the second sub-physical unit. In the future, for the specific combination of the first temperature data and the second temperature data (for example, the writing temperature is 25 degrees and the reading temperature is 70 degrees), the reading voltage level sorted first (that is, the reading voltage level with the highest priority) may be preferably determined as the first reading voltage level and used to read the target data from the second sub-physical unit. In this way, the efficiency of reading and decoding the target data can be further improved.

FIG. 7 is a flow chart of a reading voltage management method according to an embodiment of the disclosure. Referring to FIG. 7, in Step S701, a first physical unit is selected from the memory module. In Step S702, a first sub-physical unit in the first physical unit is divided into multiple information windows, in which the multiple information windows are dedicated to storing temperature data related to a second physical unit in the memory module, the first physical unit is different from the second physical unit, and a total quantity of the plurality of information windows is the same as a total quantity of the plurality of sub-physical units in the second physical unit. In Step S703, a read command is received from a host system, in which the read command instructs to read the target data from at least one logical unit, and the at least one logical unit is mapped to a second sub-physical unit in the second physical unit. In Step S704, according to the read command, a first read command sequence is sent to the memory module to instruct the memory module to read first temperature data related to the second sub-physical unit from a first information window among the plurality of information windows. In Step S705, the first voltage level is determined based on the first temperature data. In Step S706, a second read command sequence is sent to the memory module based on the first reading voltage level to instruct the memory module to read the target data from the second sub-physical unit based on the first reading voltage level to respond to the read command.

FIG. 8 is a flow chart of the reading voltage management method according to an embodiment of the disclosure. Referring to FIG. 8, in Step S801, a read command is received from the host system, in which the read command instructs to read target data from at least one logical unit, and the at least one logical unit is mapped to a second sub-physical unit in the second physical unit. In Step S802, according to the read command, a third read command sequence is sent to the memory module to instruct the memory module to read the target data from the second sub-physical unit based on a preset reading voltage level corresponding to the second sub-physical unit. In Step S803, a decoding operation is performed on the target data read based on the preset reading voltage level. In Step S804, whether the decoding operation performed on the target data fails is determined. If the decoding operation performed on the target data does not fail (that is, the decoding operation performed on the target data successfully corrects all errors in the target data), then in Step S805, the data successfully decoded is transmitted to the host system.

However, if the decoding operation performed on the target data fails (that is, the decoding operation performed on the target data does not successfully correct all errors in the target data), then in Step S806, the first read command sequence is sent to the memory module to instruct the memory module to read first temperature data related to the second sub-physical unit from a first information window among the plurality of information windows. In Step S807, the first voltage level is determined based on the first temperature data. In Step S808, a second read command sequence is sent to the memory module based on the first reading voltage level to instruct the memory module to read the target data from the second sub-physical unit based on the first reading voltage level to respond to the read command.

However, each step in FIG. 7 and FIG. 8 has been described in detail above, so details will not be repeated here. It should be noted that each step in FIG. 7 and FIG. 8 may be implemented as multiple program codes or circuits, and the disclosure is not limited thereto. In addition, the method in FIG. 7 and FIG. 8 may be used together with the exemplary embodiments mentioned above, or may be used alone, and the disclosure is not limited thereto.

In summary, the disclosure provides a reading voltage management method and a storage device, which can improve the problem of decreased reading efficiency (for example, there are too many error bits in the data read) when conventionally a specific reading voltage level is used to read data while ignoring the temperature when writing data and the temperature when reading data, which can improve the efficiency of accessing data of the storage device in the future.

Finally, it should be noted that the above embodiments are only used to illustrate the technical solutions of the disclosure, and the embodiments are not to limit the disclosure. Although the disclosure has been described in detail with reference to the embodiments, persons skilled in the art should understand that the technical solutions described in the embodiments may still be modified, or some or all of the technical features thereof may be substituted by equivalents. However, the modifications or substitutions do not make the essence of the corresponding technical solutions deviate from the scope of the technical solutions of the embodiments of the disclosure.

What is claimed is:

1. A reading voltage management method for a memory module, wherein the memory module comprises a plurality of physical units, and the reading voltage management method comprises:

selecting a first physical unit from the plurality of physical units;

dividing a first sub-physical unit in the first physical unit into a plurality of information windows, wherein the plurality of information windows are dedicated to storing temperature data related to a second physical unit among the plurality of physical units, the first physical unit is different from the second physical unit, and a total quantity of the plurality of information windows is same as a total quantity of a plurality of sub-physical units in the second physical unit;

receiving a read command from a host system, wherein the read command instructs to read target data from at least one logical unit, and the at least one logical unit is mapped to a second sub-physical unit in the second physical unit;

sending a first read command sequence to the memory module according to the read command to instruct the memory module to read first temperature data related to the second sub-physical unit from a first information window among the plurality of information windows;

determining a first reading voltage level according to the first temperature data; and sending a second read command sequence to the memory module based on the first reading voltage level to instruct the memory module to read the target data from the second sub-physical unit based on the first reading voltage level to respond to the read command.

2. The reading voltage management method according to claim 1, wherein each of the plurality of information windows is dedicated to storing temperature data related to each of the sub-physical units in the second physical unit.

3. The reading voltage management method according to claim 1, wherein the first temperature data reflects a temperature value of the memory module measured when a data writing operation is performed on the second sub-physical unit to store the target data.

4. The reading voltage management method according to claim 1, wherein sending the first read command sequence to the memory module according to the read command comprises:

sending a third read command sequence to the memory module according to the read command before sending the first read command sequence to instruct the memory module to read the target data from the second sub-physical unit based on a preset reading voltage level corresponding to the second sub-physical unit;

performing a decoding operation on the target data read based on the preset reading voltage level; and sending the first read command sequence to the memory module in response to the decoding operation failing.

5. The reading voltage management method according to claim 1, wherein determining the first reading voltage level according to the first temperature data comprises:

obtaining second temperature data through a temperature sensor, wherein the second temperature data reflects a current temperature value of the memory module;

selecting a first voltage information table grid from a plurality of candidate voltage information table grids according to the first temperature data and the second temperature data; and determining the first reading voltage level according to voltage management information in the first voltage information table grid.

6. The reading voltage management method according to claim 5, wherein the plurality of candidate voltage information table grids comprise a first candidate voltage information table grid, a second candidate voltage information table grid, a third candidate voltage information table grid, and a fourth candidate voltage information table grid, the first candidate voltage information table grid records first category voltage management information corresponding to a combination of first category writing temperature data and first category reading temperature data, the second candidate voltage information table grid records second category voltage management information corresponding to a combination of the first category writing temperature data and second category reading temperature data, the third candidate voltage information table grid records third category voltage management information corresponding to a combination of second category writing temperature data and the first category reading temperature data, and the fourth candidate voltage information table grid records fourth category voltage management information corresponding to a combination of the second category writing temperature data and the second category reading temperature data.

7. The reading voltage management method according to claim 6, wherein selecting the first voltage information table grid from the plurality of candidate voltage information table grids according to the first temperature data and the second temperature data comprises:

determining whether the first temperature data belongs to the first category writing temperature data or the second category writing temperature data;

determining whether the second temperature data belongs to the first category reading temperature data or the second category reading temperature data;

selecting the first candidate voltage information table grid as the first voltage information table grid in response to the first temperature data belonging to the first category writing temperature data and the second temperature data belonging to the first category reading temperature data;

selecting the second candidate voltage information table grid as the first voltage information table grid in response to the first temperature data belonging to the first category writing temperature data and the second temperature data belonging to the second category reading temperature data;

selecting the third candidate voltage information table grid as the first voltage information table grid in response to the first temperature data belonging to the second category writing temperature data and the second temperature data belonging to the first category reading temperature data; and selecting the fourth candidate voltage information table grid as the first voltage information table grid in response to the first temperature data belonging to the first category writing temperature data and the second temperature data belonging to the second category reading temperature data.

8. The reading voltage management method according to claim 1, further comprising:

sending a first write command sequence to the memory module to instruct the memory module to store the target data in the second sub-physical unit;

obtaining the first temperature data through a temperature sensor when a data writing operation is performed on the second sub-physical unit to store the target data; and sending a second write command sequence to the memory module after the second physical unit is fully written to instruct the memory module to store the first temperature data in the first information window in the first sub-physical unit.

9. The reading voltage management method according to claim 1, further comprising:

obtaining the first temperature data through a temperature sensor when a data writing operation is performed on the second sub-physical unit to store the target data; and sending a third write command sequence to the memory module to instruct the memory module to store the target data in a data area of the second sub-physical unit and to synchronously store the first temperature data in an spare area of the second sub-physical unit.

10. A storage device, comprising:

a connection interface unit, configured to connect to a host system;

a memory module; and a memory controller connected to the connection interface unit and the memory module, wherein the memory module comprises a plurality of physical units, and the memory controller is configured to:

select a first physical unit from the plurality of physical units;

divide a first sub-physical unit in the first physical unit into a plurality of information windows, wherein the plurality of information windows are dedicated to storing temperature data related to a second physical unit among the plurality of physical units, the first physical unit is different from the second physical unit, and a total quantity of the plurality of information windows is same as a total quantity of a plurality of sub-physical units in the second physical unit;

receive a read command from a host system, wherein the read command instructs to read target data from at least one logical unit, and the at least one logical unit is mapped to a second sub-physical unit in the second physical unit;

send a first read command sequence to the memory module according to the read command to instruct the memory module to read first temperature data related to the second sub-physical unit from a first information window among the plurality of information windows;

determine a first reading voltage level according to the first temperature data; and send a second read command sequence to the memory module based on the first reading voltage level to instruct the memory module to read the target data from the second sub-physical unit based on the first reading voltage level to respond to the read command.

11. The storage device according to claim 10, wherein each of the plurality of information windows is dedicated to storing temperature data related to each of the sub-physical units in the second physical unit.

12. The storage device according to claim 10, wherein the first temperature data reflects a temperature value of the memory module measured when a data writing operation is performed on the second sub-physical unit to store the target data.

13. The storage device according to claim 10, wherein the memory controller sending the first read command sequence to the memory module according to the read command comprises:

sending a third read command sequence to the memory module according to the read command before sending the first read command sequence to instruct the memory module to read the target data from the second sub-physical unit based on a preset reading voltage level corresponding to the second sub-physical unit;

performing a decoding operation on the target data read based on the preset reading voltage level; and sending the first read command sequence to the memory module in response to the decoding operation failing.

14. The storage device according to claim 10, wherein the memory controller determining the first reading voltage level according to the first temperature data comprises:

obtaining second temperature data through a temperature sensor, wherein the second temperature data reflects a current temperature value of the memory module;

selecting a first voltage information table grid from a plurality of candidate voltage information table grids according to the first temperature data and the second temperature data; and determining the first reading voltage level according to voltage management information in the first voltage information table grid.

15. The storage device according to claim 14, wherein the plurality of candidate voltage information table grids comprise a first candidate voltage information table grid, a second candidate voltage information table grid, a third candidate voltage information table grid, and a fourth candidate voltage information table grid, the first candidate voltage information table grid records first category voltage management information corresponding to a combination of first category writing temperature data and first category reading temperature data, the second candidate voltage information table grid records second category voltage management information corresponding to a combination of the first category writing temperature data and second category reading temperature data, the third candidate voltage information table grid records third category voltage management information corresponding to a combination of second category writing temperature data and the first category reading temperature data, and the fourth candidate voltage information table grid records fourth category voltage management information corresponding to a combination of the second category writing temperature data and the second category reading temperature data.

16. The storage device according to claim 15, wherein the memory controller selecting the first voltage information table grid from the plurality of candidate voltage information table grids according to the first temperature data and the second temperature data comprises:

determining whether the first temperature data belongs to the first category writing temperature data or the second category writing temperature data;

determining whether the second temperature data belongs to the first category reading temperature data or the second category reading temperature data;

selecting the first candidate voltage information table grid as the first voltage information table grid in response to the first temperature data belonging to the first category writing temperature data and the second temperature data belonging to the first category reading temperature data;

selecting the second candidate voltage information table grid as the first voltage information table grid in response to the first temperature data belonging to the first category writing temperature data and the second temperature data belonging to the second category reading temperature data;

selecting the third candidate voltage information table grid as the first voltage information table grid in response to the first temperature data belonging to the second category writing temperature data and the second temperature data belonging to the first category reading temperature data; and selecting the fourth candidate voltage information table grid as the first voltage information table grid in response to the first temperature data belonging to the first category writing temperature data and the second temperature data belonging to the second category reading temperature data.

17. The storage device according to claim 10, wherein the memory controller is further configured to:

send a first write command sequence to the memory module to instruct the memory module to store the target data in the second sub-physical unit;

obtain the first temperature data through a temperature sensor when a data writing operation is performed on the second sub-physical unit to store the target data; and send a second write command sequence to the memory module after the second physical unit is fully written to instruct the memory module to store the first temperature data in the first information window in the first sub-physical unit.

18. The storage device according to claim 10, wherein the memory controller is further configured to:

obtain the first temperature data through a temperature sensor when a data writing operation is performed on the second sub-physical unit to store the target data; and send a third write command sequence to the memory module to instruct the memory module to store the target data in a data area of the second sub-physical unit and to synchronously store the first temperature data in an spare area of the second sub-physical unit.

* * * * *